United States Patent
Oka et al.

(10) Patent No.: US 10,074,728 B2
(45) Date of Patent: Sep. 11, 2018

(54) SEMICONDUCTOR DEVICE

(71) Applicant: Toyoda Gosei Co., Ltd., Kiyosu-shi (JP)

(72) Inventors: Toru Oka, Kiyosu (JP); Takahiro Sonoyama, Kiyosu (JP)

(73) Assignee: TOYODA GOSEI CO., LTD., Kiyosu-Shi, Aichi-Ken (JP)

(*) Notice: Subject to any disclaimer, the term of this patent is extended or adjusted under 35 U.S.C. 154(b) by 0 days.

(21) Appl. No.: 15/282,846

(22) Filed: Sep. 30, 2016

(65) Prior Publication Data

US 2017/0025515 A1    Jan. 26, 2017

Related U.S. Application Data

(63) Continuation of application No. 14/205,128, filed on Mar. 11, 2014, now Pat. No. 9,508,822.

(30) Foreign Application Priority Data

Mar. 28, 2013  (JP) ................................ 2013-069258

(51) Int. Cl.
*H01L 21/8234* (2006.01)
*H01L 29/51* (2006.01)
(Continued)

(52) U.S. Cl.
CPC ........ *H01L 29/513* (2013.01); *H01L 29/2003* (2013.01); *H01L 29/4236* (2013.01);
(Continued)

(58) Field of Classification Search
CPC ............ H01L 29/513; H01L 29/66666; H01L 29/66522; H01L 29/7827; H01L 29/66462;
(Continued)

(56) References Cited

U.S. PATENT DOCUMENTS 6,278,165 B1   8/2001  Oowaki et al.
9,018,699 B2*  4/2015  Kiyosawa ........... H01L 21/0475
                                                  257/329
(Continued)

FOREIGN PATENT DOCUMENTS

CN     102484069 A   5/2012
JP     2001-244461 A  9/2001
(Continued)

OTHER PUBLICATIONS

Japanese Office Action dated Mar. 13, 2018 with an English Translation thereof.
(Continued)

*Primary Examiner* — Bitew Dinke
(74) *Attorney, Agent, or Firm* — McGinn IP Law Group, PLLC

(57) ABSTRACT

A semiconductor device comprises: a gate insulating film 190 stacked on a semiconductor layer 130; and a gate electrode layer 230 stacked on the gate insulating film 190 and provided to apply a voltage via the gate insulating film 190 for formation of a channel in the semiconductor layer 130. The gate insulating film 190 includes: a first insulation film 192 stacked on the semiconductor layer 130; and a second insulation film 194 between the first insulation film 192 and the gate electrode layer 230. When ε1 and ε2 respectively represent relative permittivities of the first and second insulation film 192, 194, d1 [nm] and d2 [nm] represent film thicknesses of the first and second insulation film 192, 194, and Vmax [V] represents a rated voltage applicable to the gate electrode layer 230, the semiconductor device is configured to satisfy ε1<ε2 and meet (C1):

(Continued)

$$\frac{V\max}{d1+\frac{\varepsilon 1}{\varepsilon 2}\cdot d2} \leq 21 \ [\text{MV/cm}]. \qquad (C1)$$

11 Claims, 12 Drawing Sheets

(51) Int. Cl.
- *H01L 29/20* (2006.01)
- *H01L 29/78* (2006.01)
- *H01L 29/423* (2006.01)
- *H01L 29/778* (2006.01)
- *H01L 29/66* (2006.01)

(52) U.S. Cl.
CPC .......... *H01L 29/517* (2013.01); *H01L 29/518* (2013.01); *H01L 29/66462* (2013.01); *H01L 29/66522* (2013.01); *H01L 29/66666* (2013.01); *H01L 29/7786* (2013.01); *H01L 29/7813* (2013.01); *H01L 29/7827* (2013.01); *H01L 29/7835* (2013.01)

(58) Field of Classification Search
CPC ............. H01L 29/7835; H01L 29/4236; H01L 29/7786; H01L 29/7813; H01L 29/2003; H01L 29/517; H01L 29/518; H01L 21/823462; H01L 21/823857; H01L 27/088

See application file for complete search history.

(56) References Cited

U.S. PATENT DOCUMENTS

| | | | |
|---|---|---|---|
| 2001/0013629 A1* | 8/2001 | Bai | H01L 21/28194 257/411 |
| 2006/0216548 A1 | 9/2006 | Mao | |
| 2007/0267655 A1 | 11/2007 | Endoh et al. | |
| 2008/0210946 A1 | 9/2008 | Okada et al. | |
| 2008/0237605 A1 | 10/2008 | Murata et al. | |
| 2009/0059676 A1 | 3/2009 | Lai et al. | |
| 2009/0206371 A1 | 8/2009 | Oka | |
| 2010/0006894 A1 | 1/2010 | Ohta | |
| 2010/0019796 A1 | 1/2010 | Saito | |
| 2010/0159656 A1 | 6/2010 | Nakata et al. | |
| 2011/0068371 A1* | 3/2011 | Oka | H01L 29/66462 257/194 |
| 2011/0079771 A1 | 4/2011 | Kanamura et al. | |
| 2012/0022338 A1 | 1/2012 | Subramaniam et al. | |
| 2012/0146728 A1 | 6/2012 | Makiyama et al. | |
| 2012/0199889 A1* | 8/2012 | Miyamoto | H01L 29/201 257/288 |
| 2012/0205663 A1* | 8/2012 | Nakamura | H01L 23/291 257/76 |
| 2012/0223338 A1* | 9/2012 | Mitani | H01L 21/02178 257/77 |
| 2012/0273795 A1 | 11/2012 | Li | |
| 2013/0105811 A1 | 5/2013 | Ando et al. | |
| 2013/0240896 A1* | 9/2013 | Ozaki | H01L 29/7786 257/76 |
| 2013/0292700 A1* | 11/2013 | Teramoto | H01L 21/02164 257/76 |
| 2013/0306982 A1 | 11/2013 | Kudou | |
| 2014/0061725 A1 | 3/2014 | Park et al. | |
| 2014/0264274 A1 | 9/2014 | Nakayama et al. | |
| 2014/0264364 A1 | 9/2014 | Kanamura | |
| 2014/0353722 A1 | 12/2014 | Zhang et al. | |
| 2015/0168747 A1 | 6/2015 | Kadono et al. | |

FOREIGN PATENT DOCUMENTS

| | | | | |
|---|---|---|---|---|
| JP | 2002-324813 A | | 11/2002 | |
| JP | 2003-212692 A | | 7/2003 | |
| JP | 2004-311961 A | | 11/2004 | |
| JP | 2006-140374 A | | 6/2006 | |
| JP | WO 2006/080109 A | | 8/2006 | |
| JP | 2007-067266 A | | 3/2007 | |
| JP | 2007-311740 A | | 11/2007 | |
| JP | 2008-243927 A | | 10/2008 | |
| JP | 2009-111345 A | | 5/2009 | |
| JP | 2009-200096 A | | 9/2009 | |
| JP | 2009-302435 A | | 12/2009 | |
| JP | 2010-166040 A | | 7/2010 | |
| JP | 2011-071206 A | | 4/2011 | |
| JP | 2011-233695 A | | 11/2011 | |
| JP | 2011233695 A | * | 11/2011 | ......... H01L 29/4236 |
| WO | WO 2011/027831 A1 | | 3/2011 | |

OTHER PUBLICATIONS

Japanese Office Action dated Jun. 5, 2018, with an English translation.

* cited by examiner

Fig.6

| | First Insulation Film | | | Second Insulation Film | | | Calculated Value of Math Expression (8) [MV/cm] | Evaluation | Voltage where a shift of threshold voltage occurs [V] |
|---|---|---|---|---|---|---|---|---|---|
| | Material | d1 (nm) | ε1 | Material | d2 (nm) | ε2 | | | |
| Sample A1 | SiO$_2$ | 12 | 4 | ZrO$_2$ | 40 | 20 | 15 | ◎ | 17 |
| Sample A2 | SiO$_2$ | 4 | 4 | ZrO$_2$ | 48 | 20 | 22 | × | 10 |

Fig.7

| | First Insulation Film | | | Second Insulation Film | | | Calculated Value of Math Expression (8) [MV/cm] | Evaluation | Voltage where a shift of threshold voltage occurs [V] | Rated Voltage [V] |
|---|---|---|---|---|---|---|---|---|---|---|
| | Material | d1 (nm) | ε1 | Material | d2 (nm) | ε2 | | | | |
| Sample A3 | SiO$_2$ | 12 | 4 | ZrO$_2$ | 10 | 20 | 11 | ◎ | 12 | 15 |
| Sample A4 | SiO$_2$ | 12 | 4 | ZrO$_2$ | 25 | 20 | 14 | ◎ | 14 | 23 |
| Sample A5 | SiO$_2$ | 12 | 4 | ZrO$_2$ | 40 | 20 | 15 | ◎ | 17 | 30 |
| Sample A6 | SiO$_2$ | 12 | 4 | ZrO$_2$ | 55 | 20 | 17 | ○ | 19 | 38 |
| Sample A7 | SiO$_2$ | 12 | 4 | ZrO$_2$ | 70 | 20 | 17 | ○ | 21 | 45 |

Fig.9

| | First Insulation Film | | | Second Insulation Film | | | Calculated Value of Math Expression (8) [MV/cm] | Evaluation | Voltage where a shift of threshold voltage occurs[V] |
|---|---|---|---|---|---|---|---|---|---|
| | Material | d1 (nm) | ε1 | Material | d2 (nm) | ε2 | | | |
| Sample B1 | $SiO_2$ | 10 | 4 | ZrON | 50 | 24 | 16 | ◎ | 16 |
| Sample B2 | $Al_2O_3$ | 10 | 8 | ZrON | 50 | 24 | 11 | ◎ | 22 |

Fig.11

| | First Insulation Film | | | Second Insulation Film | | | | | | | Calculated Value of Math Expression (8) [MV/cm] | Evaluation | Voltage where a shift of threshold voltage occurs [V] |
|---|---|---|---|---|---|---|---|---|---|---|---|---|---|
| | | | | First Film | | | Second Film | | | First Film + Second Film | | | |
| | Material | d1 (nm) | ε1 | Material | d2a (nm) | ε2a | Material | d2b (nm) | ε2b | d2 (nm) | ε2 | | | |
| Sample C1 | SiO₂ | 10 | 4 | Al₂O₃ | 10 | 8 | ZrON | 30 | 24 | 40 | 16 | 15 | ◎ | 17 |

Fig.13

| | First Insulation Film | | | Second Insulation Film | | | Calculated Value of Math Expression (8) [MV/cm] | Evaluation | Voltage where a shift of threshold voltage occurs[V] |
|---|---|---|---|---|---|---|---|---|---|
| | Material | d1 (nm) | ε1 | Material | d2 (nm) | ε2 | | | |
| Sample D1 | SiO$_2$ | 10 | 4 | HfO$_2$ | 40 | 16 | 15 | ◎ | 17 |
| Sample D2 | SiO$_2$ | 4 | 4 | HfO$_2$ | 55 | 16 | 19 | ○ | 13 |

SEMICONDUCTOR DEVICE

REFERENCE TO RELATED APPLICATION

This Application is a Continuation Application of U.S. patent application Ser. No. 14/205,128, which was filed on Mar. 11, 2014, and the disclosure of which is incorporated herein in its entirety by reference thereto.

TECHNICAL FIELD

The present invention relates to a semiconductor device.

BACKGROUND ART

With a view to reducing leak current, enhancing the capacitance (gain) and improving the mobility, a gate insulating film formed by stacking (i) a first layer made of, for example, silicon dioxide ($SiO_2$) having low relative permittivity but allowing for reduction of the interface state density and (ii) a second layer made of a high-k material (oxide or oxynitride of, for example, Hf or Zr) having high relative permittivity is used as the insulating film material for semiconductors. In such technologies, the first layer is stacked on a semiconductor layer, and the second layer is placed between the first layer and a gate electrode layer.

DISCLOSURE OF THE INVENTION

The high-k material is, however, likely to be crystallized at relatively low temperature. Crystallization of the high-k material in the middle of the manufacturing process readily generates carrier trapping levels in the insulating film. In the case of power semiconductor devices applied high voltage, when a high voltage is applied to the gate insulating film to form a channel (i.e., to accumulate the capacitance) under the gate insulating film, the prior art uses a thin gate insulating film (first layer/lower layer) on the semiconductor layer side and is likely to cause leak current (tunnel current) in the lower layer of the gate insulating film. When the above leak current is generated at a low bias point where carriers for the channel are not sufficiently accumulated, the carriers flow out to a high-k insulating film (second layer/upper layer) via the lower layer of the gate insulating film and are trapped inside the high-k insulating film. This results in a shift of threshold voltage to the applied voltage side. It takes time to release the trapped carriers. The threshold voltage is thus kept shifted when voltage application is once back to 0 V and then some voltage is applied. This causes a problem that the channel is not formed enough and electric current is reduced under application of an identical voltage. This problem is especially significant in semiconductor devices for power conversion (power devices), since the voltage applied to the gate insulating film is higher than Si-based microelectronic devices.

In order to address at least part of the problems described above, the invention may be implemented by the following aspects.

(1) According to one aspect of the invention, there is provided a semiconductor device, comprising: a gate insulating film stacked on one surface of a semiconductor layer; and a gate electrode layer stacked on the gate insulating film and provided to apply a voltage via the gate insulating film for formation of a channel in the semiconductor layer, wherein the gate insulating film includes: a first insulation film stacked on one surface of the semiconductor layer; and a second insulation film placed between the first insulation film and the gate electrode layer, and wherein when $\varepsilon 1$ and $\varepsilon 2$ respectively represent relative permittivities of the first insulation film and the second insulation film, d1 [nm] and d2 [nm] represent film thicknesses of the first insulation film and the second insulation film, and Vmax [V] represents a rated voltage applicable to the gate electrode layer, the gate insulating film is configured to satisfy $\varepsilon 1 < \varepsilon 2$ and meet Math Expression (C1):

$$\frac{V\max}{d1 + \frac{\varepsilon 1}{\varepsilon 2} \cdot d2} \leq 21 \ [\text{MV/cm}]. \tag{C1}$$

The rated voltage herein means a maximum voltage applicable to the gate electrode layer in the state that the gate insulating film is usable without causing dielectric breakdown. According to this aspect, the gate insulating film is structured to meet the condition of Math Expression (C1). Even when the second insulation film is crystallized to generate carrier trapping levels in the film, this prevents leak current (tunnel current) from flowing in the first insulation film under the applied voltage during operation of the semiconductor device. Accordingly this can avoid the problem of a shift in threshold voltage under repeated applications of gate voltage during operation.

(2) In the semiconductor device of the above aspect, the gate insulating film meets Math Expression (C2):

$$\frac{V\max}{d1 + \frac{\varepsilon 1}{\varepsilon 2} \cdot d2} \leq 16 \ [\text{MV/cm}]. \tag{C2}$$

(3) According to another embodiment of the semiconductor device, the film thickness d1 of the first insulation film is equal to or greater than 10 nm.

(4) According to another embodiment of the semiconductor device, when a dielectric breakdown field intensity of the first insulation film is E1bd [MV/cm], the gate insulating film meets Math Expression (C3):

$$\frac{\varepsilon 1 \cdot E1bd}{V\max} \leq \frac{1}{\frac{d1}{\varepsilon 1} + \frac{d2}{\varepsilon 2}} \tag{C3}$$

(5) According to another embodiment of (4) of the semiconductor device, the dielectric breakdown field intensity E1bd is 10 MV/cm.

(6) According to another embodiment of the semiconductor device, the rated voltage Vmax is equal to or greater than 10 V.

(7) According to another embodiment of the semiconductor device, the first insulation film is an insulating material mainly including Si, and the second insulation film is an insulating material including an oxide or an oxynitride containing one or more species selected among Hf, Zr and Al.

(8) According to another embodiment of the semiconductor device, the first insulation film is an insulating material mainly including Al, and the second insulation film is an insulating material including an oxide or an oxynitride containing one or more species selected among Hf and Zr.

(9) According to another embodiment of the semiconductor device, the second insulation film is structured by stacking a plurality of layers.

(10) According to another embodiment of the semiconductor device, the semiconductor layer includes a group III nitride semiconductor.

BRIEF DESCRIPTION OF DRAWINGS

FIG. 6 is a diagram showing specifications of the gate insulating film according to the first embodiment and experimental results;

FIG. 7 is a diagram showing other specifications of the gate insulating film according to the first embodiment and experimental results;

FIG. 9 is a diagram showing specifications of the gate insulating film according to the second embodiment and experimental results;

FIG. 11 is a diagram showing a specification of the gate insulating film according to the third embodiment and experimental results;

FIG. 13 is a diagram showing specifications of the gate insulating film according to the fourth embodiment and experimental results.

BEST MODE FOR CARRYING OUT THE INVENTION

A. First Embodiment (1) General Structure of Semiconductor Device

Figure 1:
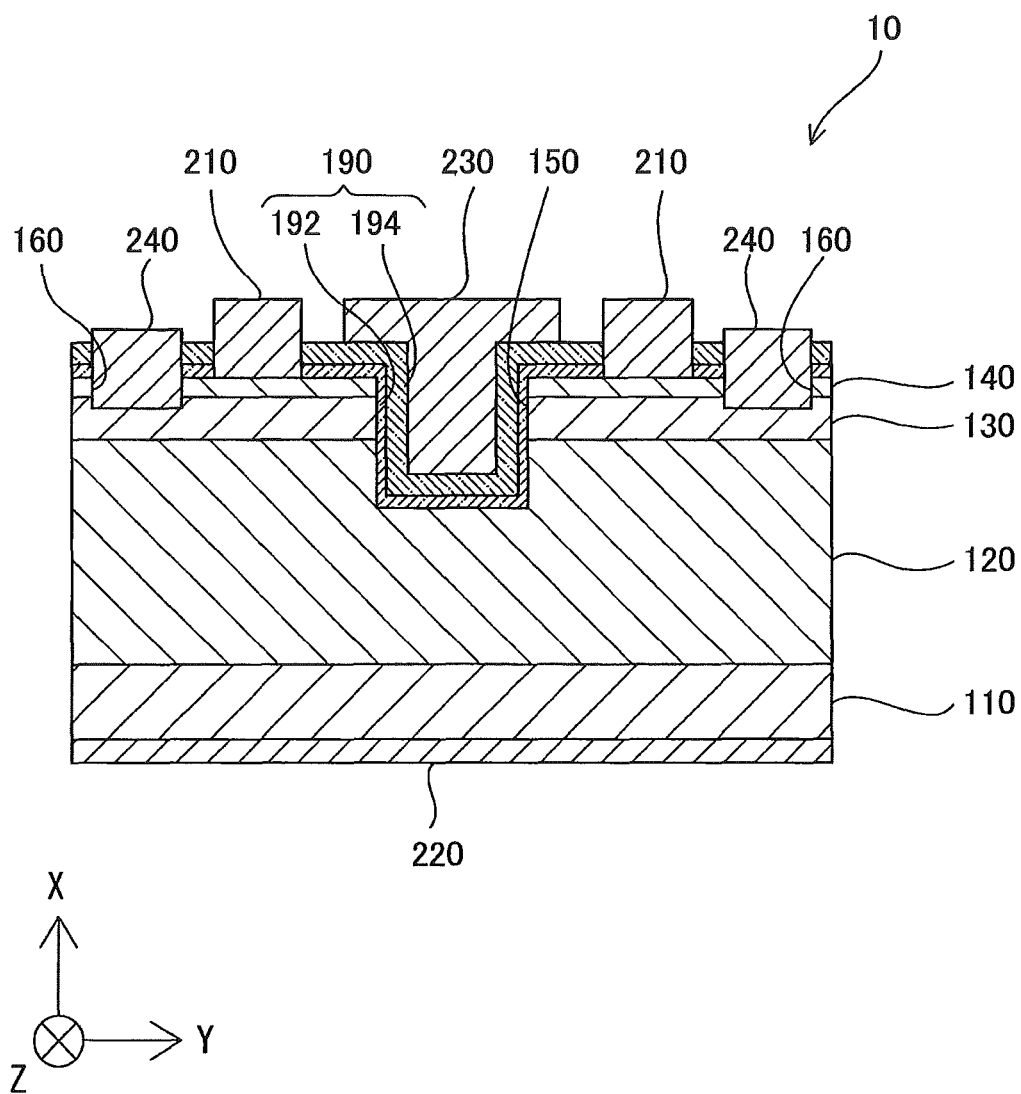
FIG. 1 is a cross sectional view schematically illustrating the structure of a semiconductor device according to a first embodiment.

FIG. 1 is a cross sectional view schematically illustrating the structure of a semiconductor device 10 according to a first embodiment. The semiconductor device 10 is a vertical MOSFET and is a semiconductor element made by using gallium nitride (GaN). The semiconductor device 10 is used for, for example, power control and is also called power device. FIG. 1 illustrates part of the cross section of the semiconductor device 10 according to this embodiment. The illustration of FIG. 1 is for the purpose of indicating the technical features of the semiconductor device 10 in an easy-to-understand manner and does not accurately show the dimensions of the respective parts. XYZ axes orthogonal to one another are also shown in FIG. 1, for convenience of explanation.

The semiconductor device 10 includes a substrate 110, a first N-type semiconductor layer 120, a P-type semiconductor layer 130, a second N-type semiconductor layer 140, a gate trench 150, a recess 160, a gate insulating film 190, a source electrode layer 210, a drain electrode layer 220, a gate electrode layer 230 and a P-body electrode layer 240.

(2) Structure of Respective Parts of Semiconductor Device 10

The substrate 110 of the semiconductor device 10 is in a plate-like shape extended along the Y axis and the Z axis. The substrate 110 is a GaN substrate and contains silicon (Si) as the donor at the higher concentration than the first N-type semiconductor layer 120.

The first N-type semiconductor layer 120 is formed to be stacked in a +X direction on the substrate 110. The first N-type semiconductor layer 120 is made of GaN and contains silicon (Si) as the donor.

The P-type semiconductor layer 130 is formed to be stacked in the +X direction on the first N-type semiconductor layer 120. The P-type semiconductor layer 130 is made of GaN and contains magnesium (Mg) as the acceptor.

The second N-type semiconductor layer 140 is formed to be stacked in the +X direction on the P-type semiconductor layer 130. The second N-type semiconductor layer 140 is made of GaN and contains silicon (Si) at the donor at the higher concentration than the first N-type semiconductor layer 120.

The gate trench 150 is a trench provided for formation of a gate and extended from the surface of the second N-type semiconductor layer 140 to the first N-type semiconductor layer 120. The sectional shape of the gate trench 150 may be any other shape, such as V shape, as long as the gate trench 150 is extended from the surface of the second N-type semiconductor layer 140 to the first N-type semiconductor layer 120. The recess 160 is a concave provided for formation of the P-body electrode layer 240 and extended from the surface of the second N-type semiconductor layer 140 to the P-type semiconductor layer 130. The shape of the recess 160 may be any other shape, such as stepped shape or V shape, as long as the P-type semiconductor layer 130 is exposed on the side of the second N-type semiconductor layer 140. The shape of the side faces of the gate trench 150 and the recess 160 may not be vertical but may be inclined.

The gate insulating film 190 is an insulating film formed on the bottom face and the side face of the gate trench 150 and on the surface of the second N-type semiconductor layer 140 on the periphery of the gate trench 150. The gate insulating film 190 includes: a first insulation film 192 stacked on the faces of the semiconductor layers; and a second insulation film 194 placed between the first insulation film 192 and the gate electrode layer 230. The structure and the functions of the gate insulating film 190 will be described later in detail.

The gate electrode layer 230 is an electrode formed to cover the bottom face and the side face of the gate trench 150 and the periphery of the gate trench 150 via the gate insulating film 190. According to this embodiment, the gate electrode layer 230 has a structure made of aluminum (Al). Polysilicon may be used instead of aluminum for the gate electrode layer 230. The gate electrode layer 230 may otherwise be made of another material and may have a multi-layered structure. For example, the gate electrode layer 230 may have a two-layered structure such as gold (Au)/nickel (Ni) structure, Al/titanium (Ti) structure, Al/TiN (titanium nitride) structure (wherein Ni, Ti and TiN are on the gate insulating film side) or may have a three-layered structure such as TiN/Al/TiN structure.

The source electrode layer 210 is an electrode formed on the surface of the second N-type semiconductor layer 140. According to this embodiment, the source electrode layer 210 has a stacked structure where a layer made of aluminum (Al) is stacked on a layer made of titanium (Ti) (on the second N-type semiconductor layer 140-side). According to another embodiment, vanadium (V) or hafnium (Hf) may be used instead of Ti for the source electrode layer 210.

The drain electrode layer 220 is an electrode formed on the opposite face of the substrate 110 opposite to the face where the first N-type semiconductor layer 120 is stacked. According to this embodiment, the drain electrode 220 has a two-layer structure where a layer made of aluminum (Al) is stacked on a layer made of titanium (Ti) arranged on the substrate 110-side. According to another embodiment, vanadium (V) or hafnium (Hf) may be used instead of Ti for the drain electrode layer 220.

The P-body electrode layer 240 is an electrode formed in the recess 160 to be in ohmic contact with the P-type semiconductor layer 130. According to this embodiment, the P-body electrode layer 240 has a stacked structure where a layer made of gold (Au) is stacked on a layer made of palladium (Pd) and the Pd layer is placed on the P-type semiconductor layer 130-side. According to another embodiment, the P-body electrode layer 240 may be an electrode including at least one of electrically conductive materials such as nickel (Ni), platinum (Pt) and cobalt (Co).

(3) Production Method of Semiconductor Device

Figure 2:
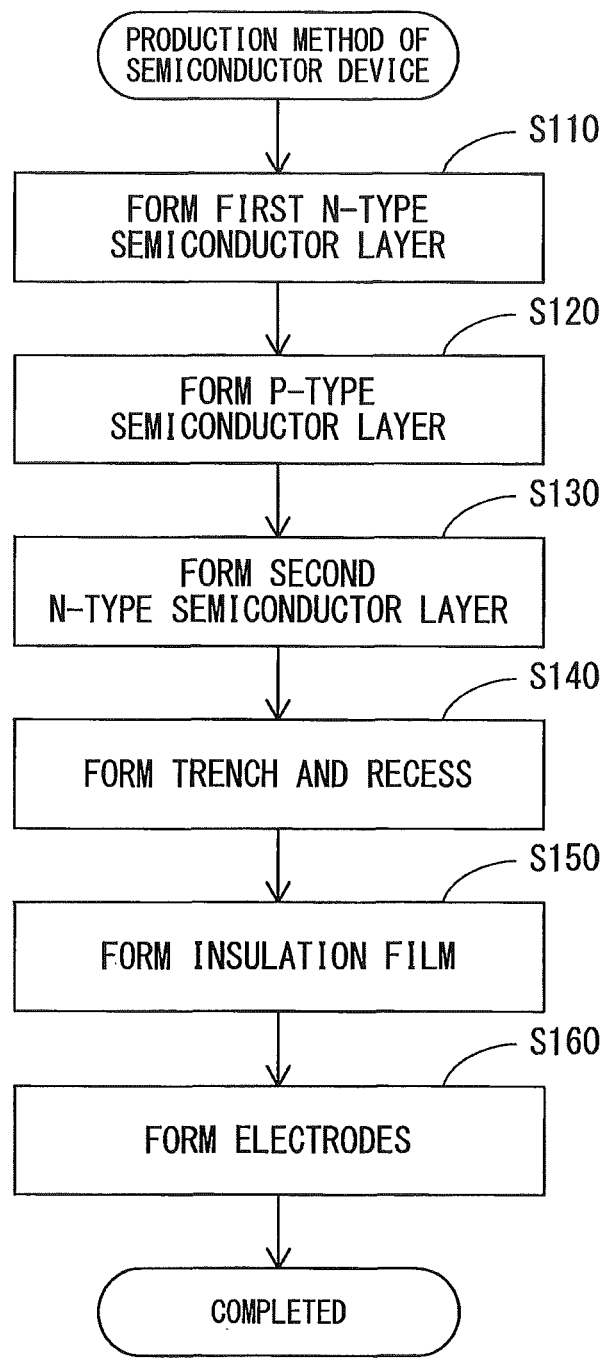
FIG. 2 is a flowchart showing a production method of semiconductor device according to the first embodiment.

FIG. 2 is a flowchart showing a production method of the semiconductor device 10 according to the first embodiment. The production method first forms the first N-type semiconductor layer 140 on the substrate 110 by crystal growth (step S110). The production method then sequentially forms the P-type semiconductor layer 130 and the second N-type semiconductor layer 140 (steps S120 and S130). The production method subsequently forms the gate trench 150 for formation of the gate and the recess 160 for formation of the P-body electrode layer 240 by dry etching (step S140).

The production method subsequently forms the gate insulating film 190 over the gate trench 150 and the second N-type semiconductor layer 140 (step S150). The two layers, i.e., the first insulation film 192 and the second insulation film 194, of the gate insulating film 190 are sequentially formed. The production method then forms the electrodes (S160). The source electrode layer 210 is formed to be connected with the second N-type semiconductor layer 140. The P-body electrode layer 240 is formed to be connected with the P-type semiconductor layer 130. Heat treatment is performed to reduce the contact resistances between these electrodes and the semiconductor layers. Heat treatment of the source electrode layer 210 and the P-body electrode layer 240 may be performed simultaneously or may be performed separately. More specifically, the procedure may perform heat treatment for the source electrode layer 210 after formation of the source electrode layer 210 and subsequently perform heat treatment for the P-body electrode layer 240 after formation of the P-body electrode layer 240, or vice versa. Additionally, the gate electrode layer 230 is formed, and the drain electrode layer 220 is formed on the rear face of the substrate 110. Heat treatment is then performed to reduce the contact resistances between these electrodes and the semiconductor layers. The electrodes are formed at step S160 according to the above procedure.

The above series of steps produce the semiconductor device 10 according to this embodiment.

(4) Operations of Semiconductor Device 10

In the semiconductor device 10, in the state that no voltage is applied to the gate electrode layer 230, the source electrode layer 210 and the drain electrode layer 220 have no electrical continuity by the presence of the P-type semiconductor layer 130. When the voltage applied to the gate electrode layer 230 (hereinafter referred to as gate voltage) becomes equal to or greater than a predetermined value, on the other hand, an inversion layer is formed on the P-type semiconductor layer 130-side in the vicinity of the interface of the gate insulating film 190. This inversion layer serves as a channel, so that when a voltage is applied between the source electrode layer 210 and the drain electrode layer 220, the source electrode layer 210 and the drain electrode layer 220 have electrical continuity via the second N-type semiconductor layer 140, the inversion layer formed on the P-type semiconductor layer 130, the first N-type semiconductor layer 120 and the substrate 110.

(5) Functions and Advantageous Effects of Embodiment (5)-1 Characteristics of Gate Insulating Film 190

Figure 3:
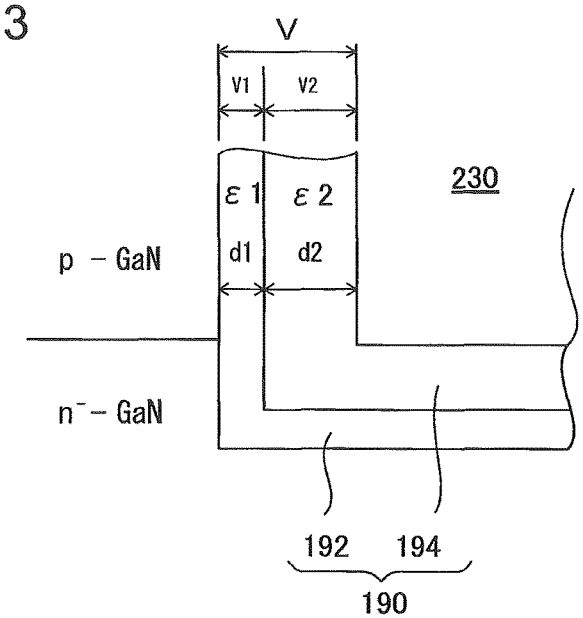
FIG. 3 is a diagram illustrating a relationship between the voltage applied to a gate electrode layer and the voltage consequently applied to a gate insulating film.

FIG. 3 is a diagram illustrating a relationship between the gate voltage applied to the gate electrode layer 230 and the voltage consequently applied to the gate insulating film 190. The following describes the characteristics of the gate insulating film 190 during operation of the semiconductor device 10.

As shown in FIG. 3, when an operation voltage of the semiconductor device 10 is applied, in other words, when such a voltage as to accumulate carriers below the gate insulating film 190 is applied, the relationships of Math Expressions (4) and (5) are satisfied, when V [V] represents a gate voltage applied to the gate electrode layer 230; V1 [V] and V2 [V] respectively represent voltages applied to the first insulation film 192 and the second insulation film 194; d1 [nm] and d2 [nm] respectively represent film thicknesses of the first insulation film 192 and the second insulation film 194; and ε1 and ε2 respectively represent relative permittivities of the first insulation film 192 and the second insulation film 194.

$$V = V1 + V2 \quad (4)$$

V: Applied voltage
V1: Voltage applied to first insulation film
V2: Voltage applied to second insulation film $$\frac{\varepsilon 1 \cdot V1}{d1} = \frac{\varepsilon 2 \cdot V2}{d2} \quad (5)$$

ε1: Relative permittivity of first insulation film
ε2: Relative permittivity of second insulation film
d1: Film thickness of first insulation film
d2: Film thickness of second insulation film According to Math Expressions (4) and (5), the voltage V1 applied to the first insulation film 192 is expressed by Math Expression (6). A flat band shift voltage caused by the effect of fixed charges present on the interface between the insulating film/semiconductor is negligibly smaller than a rated voltage Vmax [V] applicable to the gate electrode layer 230 and is thereby not included in Math Expression (5).

$$V1 = \frac{V \cdot \varepsilon 2 \cdot d1}{\varepsilon 2 \cdot d1 + \varepsilon 1 \cdot d2} \tag{6}$$

The gate voltage V during operation of the semiconductor device 10 is preferably ⅓ to ½ of the rated voltage Vmax, in terms of the reliability. With respect to the applied voltage during operation of the semiconductor device, in order to suppress a shift of threshold voltage in the direction of the applied voltage, there is a need to prevent a large amount of leak current from flowing in the first insulation film 192. In other words, the design is required to prevent FN (Fowler-Nordheim) tunnel current from flowing in the first insulation film 192. In insulating films of relatively high withstand voltage, such as $SiO_2$, SiN and $Al_2O_3$, a field intensity E1 [MV/cm] which often causes FN tunnel current is 7 to 8 MV/cm, although this value depends on the film type and the film properties of the first insulation film 192. It is accordingly preferable that the field intensity applied to the first insulation film 192 is equal to or less than 7 to 8 MV/cm when the gate voltage V is ⅓ to ½ of the rated voltage Vmax.

The relationship between the film thickness d1 of the first insulation film 192 and the voltage V1 applied to the first insulation film 192 is expressed by Math Expression (7) and is additionally expressed by Math Expression (8) by substitution of Math Expression (6) into Math Expression (7). Math Expression (8a) shows the case where the gate voltage V is ⅓ of the rated voltage Vmax and the field intensity E1 is equal to 7 MV/cm. Math Expression (8b) shows the case where the gate voltage V is ½ of the rated voltage Vmax and the field intensity E1 is equal to 8 MV/cm.

$$\frac{V1}{d1} \leq 7 \text{ [MV/cm]} \sim \frac{V1}{d1} \leq 8 \text{ [MV/cm]} \tag{7}$$

$$\frac{Vmax}{d1 + \frac{\varepsilon 1}{\varepsilon 2} \cdot d2} \leq 21 \text{ [MV/cm]} \sim \frac{Vmax}{d1 + \frac{\varepsilon 1}{\varepsilon 2} \cdot d2} \leq 16 \text{ [MV/cm]} \tag{8}$$

$$\frac{Vmax}{d1 + \frac{\varepsilon 1}{\varepsilon 2} \cdot d2} \leq 21 \text{ [MV/cm]} \tag{8a}$$

$$\frac{Vmax}{d1 + \frac{\varepsilon 1}{\varepsilon 2} \cdot d2} \leq 16 \text{ [MV/cm]} \tag{8b}$$

The gate insulating film 190 designed to satisfy Math Expression (8) described above can suppress a shift of threshold voltage, because of the reasons described below.

Figure 4A:
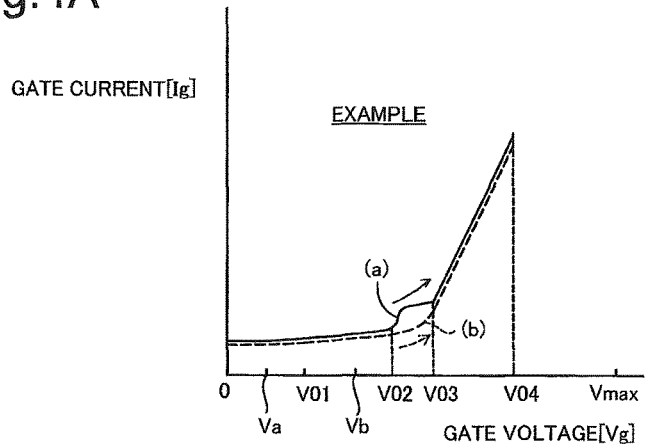
FIGS. 4A and 4B are diagrams showing relationships between the voltage applied to a gate electrode layer of a semiconductor device and the electric current flowing in the gate electrode layer.
Figure 4B:
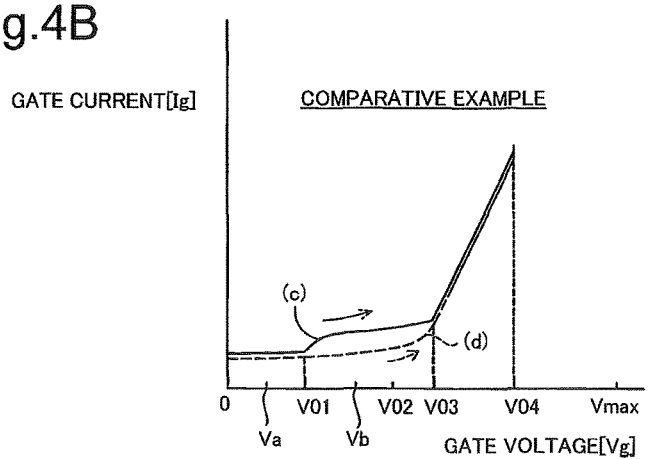

FIGS. 4A and 4B are diagrams showing relationships between the voltage applied to a gate electrode layer of a semiconductor device and the electric current flowing in the gate electrode layer (hereinafter referred to as gate current). The x-axis of FIG. 4 shows the gate voltage [Vg], and the y-axis shows the logarithmic value of the gate current [Ig]. The gate voltage was repeatedly applied from 0V to a voltage V04 between 0 V and the rate voltage Vmax, and the I-V characteristics were measured. FIG. 4A shows the measurement results of Example and FIG. 4B shows the measurement results of Comparative Example.

According to Example, in a first application of the gate voltage, the value of gate current changed as shown by a solid-line curve (a) in FIG. 4A with an increase in gate voltage from 0 V. In a second or subsequent application of the gate voltage, however, the value of gate current changed as shown by a broken-line curve (b) in FIG. 4A. In the second or subsequent application of the gate voltage, the gate current had different values from those of the gate current in the first application, in a gate voltage range of V02 to V03. This is attributed to the following reason. In the first application of the gate voltage, tunnel current flows in the first insulation film 192 (FIG. 3), and the carriers are trapped at the trapping levels of the second insulation film 194. It takes time to release the trapped carriers. Because of this reason, in the second or subsequent application of the gate voltage, the gate current had different values from those of the gate current in the first application of the gate voltage. The curve of electric current in the first application and the curve of electric current in the second application actually overlap with each other in a part other than the voltage range of V02 to V03. For the better technical understanding, however, the two curves are shown with a shift in FIG. 4A. In the case of measurements with repeated applications of the gate voltage in the range of not greater than V02, this phenomenon having different values in the first application and in the second or subsequent application does not occur.

According to Comparative Example, in the first application of the gate voltage, the value of gate current changed as shown by a solid-line curve (c) in FIG. 4B with an increase in gate voltage from 0 V. In the second or subsequent application of the gate voltage, however, the value of gate current changed as shown by a broken-line curve (d) in FIG. 4B. In the second or subsequent application of the gate voltage, the gate current had different values from those of the gate current in the first application, in a gate voltage range of V01 to V03 by the effect of the trapped carriers as described with respect to Example of FIG. 4A. The curve of electric current in the first application and the curve of electric current in the second application actually overlap with each other in a part other than the voltage range of V01 to V03. For the better technical understanding, however, the two curves are shown with a shift in FIG. 4B. In this Comparative Example, in the case of measurements with repeated applications of the gate voltage in the range of not greater than V01, this phenomenon having different values in the first application and in the second or subsequent application does not occur. The voltage range of V01 to V02 which did not cause the problem in Example, however, had different values.

Figure 5:
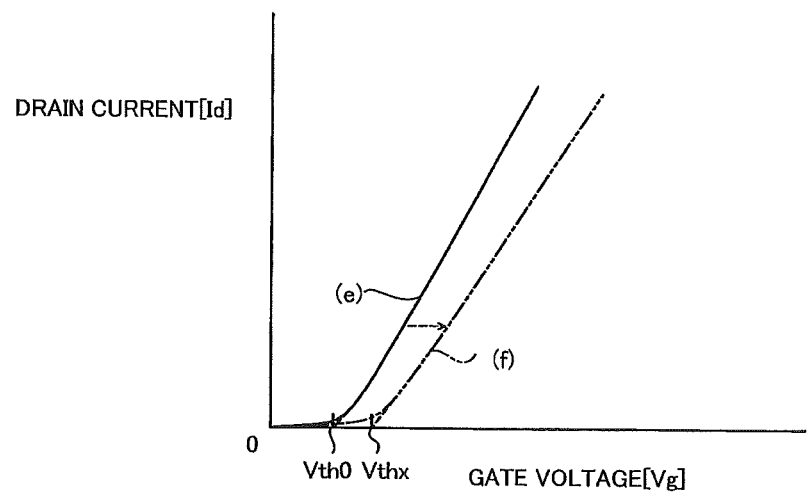
FIG. 5 is a diagram showing a relationship between the gate voltage of a semiconductor device and the electric current flowing through between a source electrode layer and a drain electrode layer.

FIG. 5 is a diagram showing a relationship between the gate voltage of a semiconductor device and the electric current flowing through between the source electrode layer and the drain electrode layer (hereinafter referred to as drain current). The x-axis of FIG. 5 shows the gate voltage [Vg], and the y-axis shows the value of drain current [Id]. For example, in Comparative Example of FIG. 4B, when a voltage Va that does not exceed the voltage V01 is applied as the gate voltage, no tunnel current flows in the first insulation film 192 (FIG. 3). The drain current accordingly has a characteristic change depending on the gate voltage as shown by a solid-line curve (e) in FIG. 5. In measurement after application of a voltage Vb exceeding the voltage V01 as the gate voltage shown in FIG. 4B, the drain current has a value change as shown by a two-dot dashed line curve (f) in FIG. 5. These results indicate a shift from a threshold voltage Vth0 to a threshold voltage Vthx.

In Example of FIG. 4A, on the other hand, even in the case of repeated applications of the voltage Vb greater than the voltage Va (but not greater than V02), as well as in the case of application of the voltage Va as the gate voltage, no tunnel current flows in the first insulation film 192, and no carriers are accumulated at the trapping levels of the second insulation film 194. The drain current accordingly shows the same characteristic change in the first application and in the second or subsequent application. These results indicate no shift of the threshold voltage.

In the case of application of the voltage Vb shown in FIG. 4A as the gate voltage during operation of the semiconductor device, on the assumption that the voltage Vb is ⅓ of the rated voltage Vmax and the field intensity E1 [MV/cm] of the above first insulation film 192 (FIG. 3) is 7 MV/cm, the gate insulating film 190 should be designed to satisfy Math Expression (8a) for production of a semiconductor device causing no shift of the threshold voltage. On the assumption that the voltage Vb is ½ of the rated voltage Vmax and the above field intensity E1 [MV/cm] is 8 MV/cm, the gate insulating film 190 should be designed to satisfy Math Expression (8b) for production of a semiconductor device causing no shift of the threshold voltage.

FIG. 6 is a diagram showing specifications of the gate insulating film 190 according to the first embodiment and experimental results. FIG. 6 shows the results with respect to samples A1 and A2. The samples A1 and A2 employed $SiO_2$ having the relative permittivity ε1=4 for the first insulation film and $ZrO_2$ having the relative permittivity ε2=20 for the second insulation film. The samples A1 and A2 were designed on the assumption that the rated voltage Vmax of 30 V was applicable to the gate electrode layer 230. With respect to the sample A1, the film thickness d1 of the first insulation film was 12 nm and the film thickness d2 of the second insulation film was 40 nm. With respect to the sample A2, the film thickness d1 of the first insulation film was 4 nm and the film thickness d2 of the second insulation film was 48 nm. The value of Math Expression (8) was obtained by substituting these values into the left side of Math Expression (8). The calculated value of Math Expression (8) is shown by the value rounded off to the unit. In the column of evaluation, the cross mark shows the case that does not satisfy Math Expression (8a), and the double circle shows the case that satisfies Math Expression (8b). The samples A1 and A2 were checked for the gate voltage at which a shift of the threshold voltage started, by repeatedly applying the gate voltage from 0 V to a specified voltage and back to 0 V. In the sample A1 satisfying Math Expression (8b), a shift of the threshold voltage occurred at the gate voltage of 17 V, in other words, at the voltage of not less than ½ of the rated voltage Vmax. In the sample A2 unsatisfying Math Expression (8a), on the other hand, a shift of the threshold voltage occurred at the gate voltage of 10 V, i.e., ⅓ of the rated voltage Vmax.

It is preferable that the first insulation film 192 satisfies Math Expression (8) and the concrete value of its film thickness d1 is not less than 10 nm. This is because the small film thickness d1 of the first insulation film 192 causes the first insulation film 192 to be affected by Coulomb scattering of fixed charges present inside of the second insulation film 194 and on the interface between the first insulation film 192 and the second insulation film 194 and reduces the mobility of the carriers flowing in the channel.

(5)-2 Film Thickness of Second Insulation Film 194

FIG. 7 is a diagram showing other specifications of the gate insulating film according to the first embodiment and experimental results. In this experimental example, samples A3 to A7 were produced and the relationship of the film thickness of the second insulation film 194 was studied. With respect to the samples A3 to A7, while the film thickness d1 of the first insulation film 192 was fixed to 12 nm, the film thickness d2 of the second insulation film 194 was 10 nm, 25 nm, 40 nm, 55 nm and 70 nm. The rated voltages Vmax of the respective samples were 15 V, 23 V, 30 V, 38 V and 45 V. The calculated value of Math Expression (8) is shown by the value rounded off to the unit. In the column of evaluation, the double circle shows the case that satisfies Math Expression (8b) and the single circle shows the case that satisfies Math Expression (8a). When a voltage equal to ⅓ of the rated voltage Vmax was applied as the gate voltage, no shift of the threshold voltage was observed in any of the samples A3 to A7. This state satisfies Math Expression (8a). When a voltage equal to ½ of the rated voltage Vmax was applied as the gate voltage with a view to reducing the channel resistance, on the other hand, a shift of the threshold voltage was observed at 55 nm (sample A6) and at 70 nm (sample A7).

The film thickness d2 of the second insulation film 194 may be determined by taking into account the following points. When the gate insulating film 190 has a single-layered structure of only the first insulation film 192, in order to prevent the first insulation film 192 from being broken at the rated voltage Vmax, it is preferable that the relationship between a dielectric breakdown field intensity E1bd of the first insulation film 192 and the film thickness d1 satisfies Math Expression (9).

$$d1 \geqq \frac{Vmax}{E1bd} \quad (9)$$

E1bd: Dielectric breakdown voltage

The transconductance of the semiconductor device 10 is a value proportional to the gate capacitance, i.e., the capacitance of the gate insulating film 190 located between the gate electrode layer 230 and the semiconductor layers. In the case of the gate insulating film 190 made of only the first insulation film 192, a gate capacitance Csingle per unit area of the gate electrode layer 230 is shown by Math Expression (10).

$$Csingle = \frac{\varepsilon 1}{d1} \quad (10)$$

Csingle: Gate capacitance in single-layered structure

Substitution of Math Expression (10) into Math Expression (9) gives Math Expression (11).

$$Csingle \leqq \frac{\varepsilon 1 \cdot E1bd}{Vmax} \quad (11)$$

In the case of the gate insulating film 190 having a two-layered structure, on the other hand, a gate capacitance Cmulti is expressed by Math Expression (12) when C1 and C2 represent gate capacitances of a first layer and a second layer.

$$\frac{1}{Cmulti} = \frac{1}{C1} + \frac{1}{C2} \quad (12)$$

Cmulti: Total gate capacitance of first layer and second layer
C1: Gate capacitance of first layer
C2: Gate capacitance of second layer The gate capacitances C1 and C2 of the respective layers satisfy the relationship of Math Expression (13), so that the Math Expression (12) is rewritten as Math Expression (14).

$$C1 = \frac{\varepsilon 1}{d1}, C2 = \frac{\varepsilon 2}{d2} \qquad (13)$$

$$Cmulti = \frac{1}{\frac{d1}{\varepsilon 1} + \frac{d2}{\varepsilon 2}} \qquad (14)$$

Employing an insulating material having the high relative permittivity ε2 for the second insulation film 194 enables an increase in gate capacitance. The excessive film thickness d2, however, lowers the gate capacitance, compared with that of the gate insulating film made of only the first insulation film 192. This degrades the advantage of the two-layered structure of the gate insulating film 190. Accordingly it is preferable to meet the condition of Math Expression (15).

$$Csingle \leq Cmulti \qquad (15)$$

Math Expression (15) is rewritten as Math Expression (16) by substitution of Math Expression (11) and Math Expression (14).

$$\frac{\varepsilon 1 \cdot E1bd}{Vmax} \leq \frac{1}{\frac{d1}{\varepsilon 1} + \frac{d2}{\varepsilon 2}} \qquad (16)$$

The film thicknesses d1 and d2 of the respective layers of the gate insulating film 190 should thus be determined to satisfy Math Expression (16). This provides the semiconductor device 10 having the high transconductance, i.e., the low channel resistance under application of an identical gate voltage. For example, in a semiconductor device provided to employ $SiO_2$ having the relative permittivity ε1=4 for the first insulation film and $ZrO_2$ having the relative permittivity ε2=20 for the second insulation film and designed to have the rated voltage Vmax equal to 30 V like the above embodiment, the following features are preferable. When the dielectric breakdown field intensity E1bd of the first insulation film $SiO_2$ is 10 MV/cm and the film thickness d1 is 12 nm, it is preferable that the film thickness d2 is equal to or less than 90 nm.

B. Second Embodiment

Figure 8:
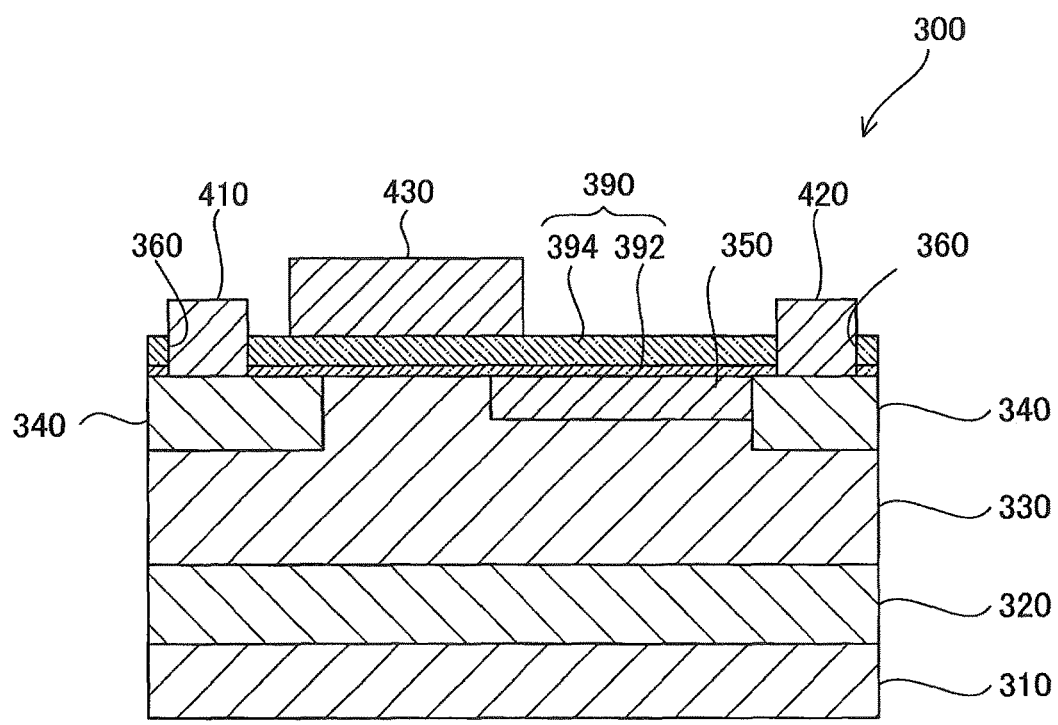
FIG. 8 is a cross sectional view schematically illustrating the structure of a semiconductor device according to a second embodiment.

FIG. 8 is a cross sectional view schematically illustrating the structure of a semiconductor device 300 according to a second embodiment. The semiconductor device 300 is a horizontal MOSFET and is a semiconductor element made by using gallium nitride (GaN). The semiconductor device 300 is used for, for example, power control and is also called power device. The semiconductor device 300 is structured by stacking a substrate 310, a buffer layer 320, a P-type semiconductor layer 330, second N-type semiconductor layers 340 and a third N-type semiconductor layer 350. The substrate 310 is a substrate made of silicon (Si). The buffer layer 320 is provided as a multi-layered nitride semiconductor layer where a thin undoped GaN layer is stacked on a thin undoped AlN layer. The P-type semiconductor layer 330 is made of GaN and contains magnesium (Mg) as the acceptor. The second N-type semiconductor layers 340 are made of GaN and are provided as high-density n layers formed by adding Si as the donor to the P-type semiconductor layer 330 by ion implantation. The second N-type semiconductor layers 340 are formed at two different positions (both sides of FIG. 8) on the P-type semiconductor layer 330. The third N-type semiconductor layer 350 is made of GaN and is provided as an n layer formed by adding Si as the donor to the P-type semiconductor layer 330 by ion implantation. The concentration of the donor is lower in the third N-type semiconductor layer 350 than in the second N-type semiconductor layers 340. The second N-type semiconductor layers 340 and the third N-type semiconductor layer 350 may be formed by adding another element other than Si which can serve as the donor and may be formed by another technique other than ion implantation, for example, impurity diffusion or selective regrowth.

A gate insulating layer 390 is stacked on the second N-type semiconductor layers 340, the P-type semiconductor layer 330 and the third N-type semiconductor layer 350. The gate insulating layer 390 includes: a first insulation film 392 formed on the faces of the semiconductor layers; and a second insulation film 394 stacked on the first insulation film 392. The gate insulating film 390 has contact holes 360 formed at two different positions (both sides of FIG. 8). A source electrode layer 410 and a drain electrode layer 420 are formed in the respective contact holes 30 to be in contact with the second N-type semiconductor layers 340 on both sides. Additionally, a gate electrode layer 430 is formed on the outer face of the gate insulating film 390 (i.e., opposite face that is opposite to the face in contact with the semiconductor layers) to be placed between the second N-type semiconductor layer 340 on the source electrode layer 410-side and the third N-type semiconductor layer 350.

The following describes the operations of the semiconductor device 300. In the state that no gate voltage is applied to the gate electrode layer 430, the source electrode layer 410 and the drain electrode layer 420 have no electrical continuity by the presence of the P-type semiconductor layer 430. When a gate voltage equal to or greater than a predetermined value is applied to the gate electrode layer 430, on the other hand, an inversion layer is formed in the P-type semiconductor layer 330 between the second N-type semiconductor layer 340 on the source electrode layer 410-side and the third N-type semiconductor layer 350. This inversion layer serves as a channel, so that when a voltage is applied between the source electrode layer 410 and the drain electrode layer 420, the source electrode layer 410 and the drain electrode layer 420 have electrical continuity via the second N-type semiconductor layer 340 on the source electrode layer 410-side, the inversion layer formed in the P-type semiconductor layer 330, the third N-type semiconductor layer 350 and the second N-type semiconductor layer 340 on the drain electrode layer 420-side.

FIG. 9 is a diagram showing specifications of the gate insulating film according to the second embodiment and experimental results. FIG. 9 shows the results with respect to samples B1 and B2. The samples B1 and B2 were produced by changing the specification of the gate insulating film 390 in the structure of the semiconductor device 300. The sample B1 employed $SiO_2$ having the relative permittivity ε1=4 for the first insulation film, and the sample B2 employed $Al_2O_3$ having the relative permittivity ε1=8 for the first insulation film. Both the samples B1 and B2 employed ZrON having the relative permittivity ε2=24 for the second insulation film. The samples B1 and B2 were designed on the assumption that the rated voltage Vmax of 30 V was applicable to the gate electrode layer 430. With respect to both the samples B1 and B2, the film thickness d1 of the first insulation film was 10 nm and the film thickness d2 of the second insulation film was 50 nm. The samples B1 and B2 were checked for a shift of the threshold voltage like the first embodiment. The calculated value of Math Expression (8) is shown by the value rounded off to the unit. In the column of evaluation, the double circle shows the case that satisfies Math Expression (8b). These results show that the specifications of both the samples B1 and B2 meet the condition of Math Expression (8). In the sample B1 employing SiO$_2$ for the first insulation film, a shift of the threshold voltage occurred at the gate voltage of 16V exceeding ½ of the rated voltage Vmax by 1 V. In the sample B2 employing Al$_2$O$_3$ for the first insulation film, on the other hand, a shift of the threshold voltage occurred at the gate voltage of 22 V significantly exceeding ½ of the rated voltage Vmax.

C. Third Embodiment

Figure 10:
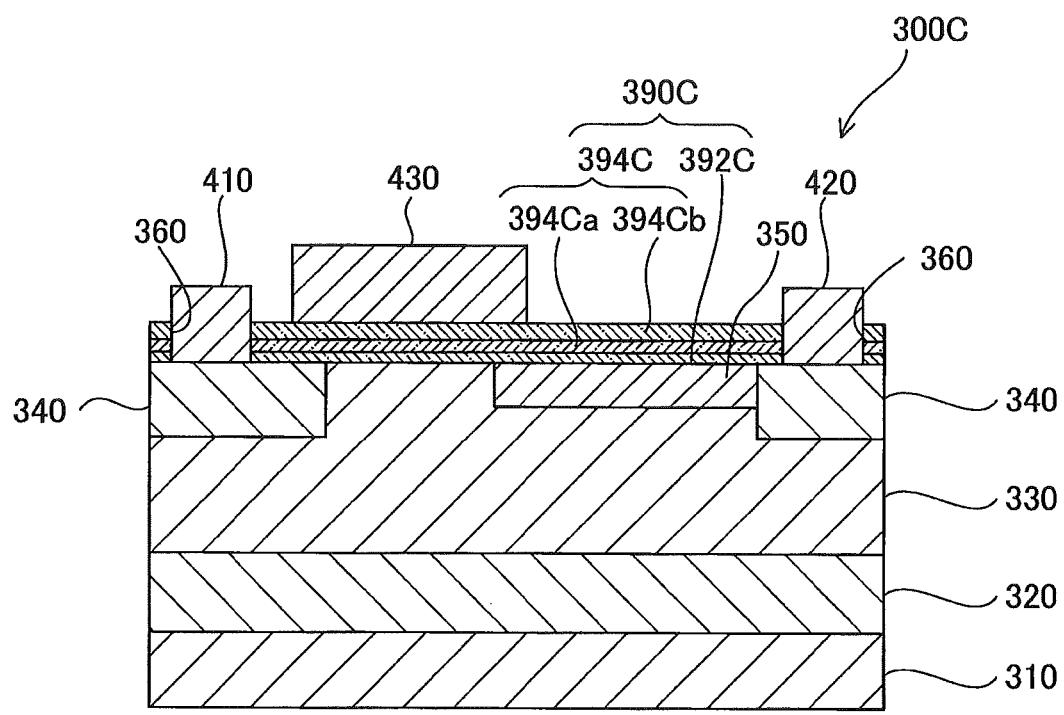
FIG. 10 is a cross sectional view schematically illustrating the structure of a semiconductor device according to a third embodiment.

FIG. 10 is a cross sectional view schematically illustrating the structure of a semiconductor device 300C according to a third embodiment. The semiconductor device 300C is characterized by an insulating film in the structure of the semiconductor device 300 shown in FIG. 8. More specifically, a gate insulating film 390C includes a first insulation film 392C and a second insulation film 394C formed on the first insulation film 392C. The second insulation film 394C is formed by stacking two layers of different materials, i.e., a first film 394Ca and a second film 394Cb.

FIG. 11 is a diagram showing a specification of the gate insulating film according to the third embodiment and experimental results. FIG. 11 shows the results with respect to a sample C1. The sample C1 employed SiO$_2$ having the relative permittivity ε1=4 for the first insulation film 392C, Al$_2$O$_3$ having the relative permittivity ε2a=8 for the first film 394Ca of the second insulation film 394C and ZrON having the relative permittivity ε2b=24 for the second film 394Cb. The sample C1 was designed on the assumption that the rated voltage Vmax of 30 V was applicable to the gate electrode layer 430. The average value of the relative permittivity ε2 of the second insulation film 394C was determined by calculating a total film thickness d2 of the first film 394 Ca and the second film 394 Cb according to Math Expression (17) and additionally applying Math Expression (19) obtained by rewriting Math Expression (18) as the math formula of series capacitance. According to the specification of the sample C1, the average value of the relative permittivity ε2 of the second insulation film 394C calculated by Math Expression (19) was 16.

$$d2 = d2a + d2b \quad (17)$$

$$\frac{d2}{\varepsilon 2} = \frac{d2a}{\varepsilon 2a} + \frac{d2b}{\varepsilon 2b} \quad (18)$$

d2a: Film thickness of first film
d2b: Film thickness of second film
ε2a: Relative permittivity of first film
ε2b: Relative permittivity of second film $$\varepsilon 2 = \frac{d2}{\frac{d2a}{\varepsilon 2a} + \frac{d2b}{\varepsilon 2b}} \quad (19)$$

With respect to the sample C1, the film thickness d1 of the first insulation film 392C was 10 nm. The film thickness d2 of the second insulation film 394C was determined according to Math Expression (17). In the sample C1, since the film thicknesses d2a and d2b of the first film 394Ca and the second film 394Cb were respectively 10 nm and 30 nm, the total film thickness d2 was 40 nm.

The sample C1 was checked for a shift of the threshold voltage like the first embodiment. The calculated value of Math Expression (8) is shown by the value rounded off to the unit. In the column of evaluation, the double circle shows the case that satisfies Math Expression (8b). In the sample of this embodiment satisfying Math Expression (8b), a shift of the threshold voltage occurred at the gate voltage of 17 V exceeding ½ of the rated voltage Vmax. When the second insulation film 394C consists of the plurality of films, i.e., the first film 394Ca and the second film 394Cb according to this embodiment, the design by considering the average value of the relative permittivity ε2 and the total film thickness d2 of the second insulation film 394C can solve the problem of a shift in threshold voltage, like the embodiments described above.

D. Fourth Embodiment

Figure 12:
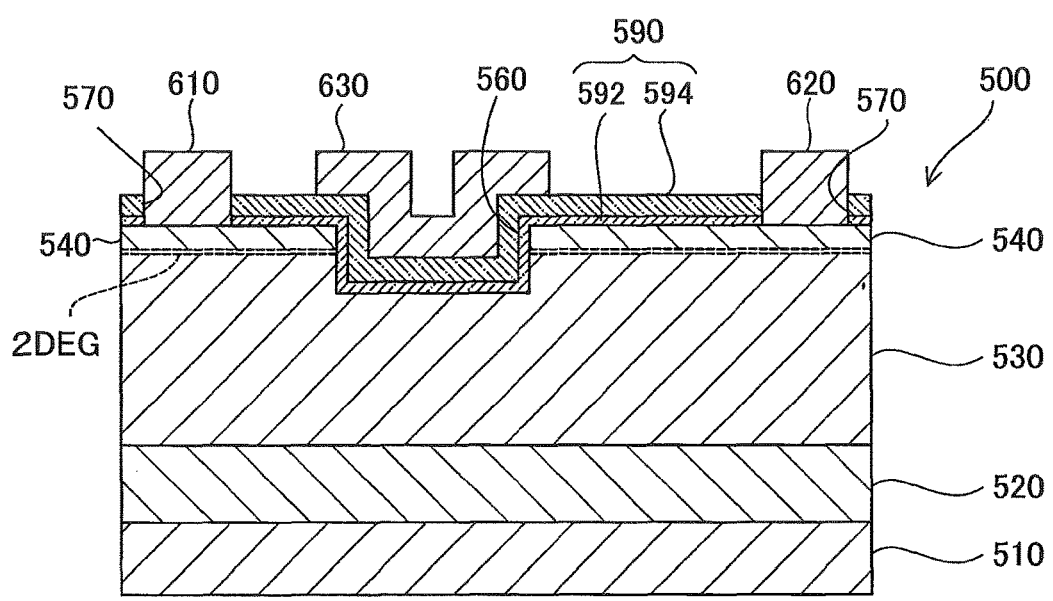
FIG. 12 is a cross sectional view schematically illustrating the structure of a semiconductor device according to a fourth embodiment.

FIG. 12 is a cross sectional view schematically illustrating the structure of a semiconductor device 500 according to a fourth embodiment. The semiconductor device 500 is a horizontal MOSFET using a two-dimensional electron gas 2DEG for a part other than a channel portion. The semiconductor device 500 is structured by stacking a substrate 510, a buffer layer 520, a carrier transporting layer 530 and a barrier layer 540.

The substrate 510 is a substrate made of silicon (Si). Another material such as sapphire, SiC or GaN may otherwise be used for the substrate 510. The buffer layer 520 is provided as a multi-layered nitride semiconductor layer where a thin undoped GaN layer is stacked on a thin undoped AlN layer. The carrier transporting layer 530 is a semiconductor layer made of undoped GaN. The barrier layer 540 is a nitride semiconductor layer made of undoped Al$_{0.25}$Ga$_{0.75}$N having the greater forbidden band width than the carrier transporting layer 530.

The two-dimensional electron gas 2DEG is produced on the carrier transporting layer 530-side by the effect of positive polarized charges on the heterojunction interface between the carrier transporting layer 530 and the barrier layer 540. According to this embodiment, the barrier layer 540 is provided as the single-layered undoped layer of AlGaN. According to other embodiments, however, the barrier layer 540 may be a multi-layered nitride semiconductor layer of, for example, GaN/AlGaN, InGaN/AlGaN, InGaN/Al GaN/AN. The barrier layer 540 may also be provided as another single-layered or multi-layered undoped or doped semiconductor layer: for example, a single-layered nitride semiconductor layer such as doped AlGaN, AlInN or AlGaInN or a multi-layered AlGaN layer including a plurality of AlGaN layers having different Al compositions or different doping concentrations.

The carrier transporting layer 530 and the barrier layer 540 are respectively single layers in this embodiment. A single or multiple pairs of carrier transporting layer/barrier layer may additionally be provided on the barrier layer 540.

A gate recess 560 is formed across the barrier layer 540 and part of the carrier transporting layer 530. A gate insulating film 590 is formed to cover the gate recess 560 and the barrier layer 540. The gate insulating film 590 is formed by stacking a second insulation film 594 on a first insulation film 592. The gate insulating film 590 has contact holes 570 formed on both sides of a gate electrode layer 630. A source electrode layer 610 is formed in the contact hole 570 on the left side of the illustration to be in contact with the illustrated left side portion of the barrier layer 540. A drain electrode layer 620 is formed in the contact hole 570 on the right side of the illustration to be in contact with the illustrated right side portion of the barrier layer 540. The gate electrode layer 630 is formed on the outer face of the gate insulating film 590 to be placed on and between the portions of the barrier layer 540. The source electrode layer 610 and the drain electrode layer 620 are in ohmic contact with the carrier transporting layer 530 by a tunnel current mechanism via the barrier layer 540.

The gate recess 560 is formed by grooving from the upper face of the barrier layer 540 to a partial depth of the carrier transporting layer 530. More specifically, in order to suppress the electric current between the source electrode layer 610 and the drain electrode layer 620 and thereby enable the normally-off state under no application of a gate voltage to the gate electrode layer 630, the depth of the gate recess 560 is determined to sufficiently part the two-dimensional electron gas 2DEG between the source electrode layer 610 and the gate electrode layer 630 and the two-dimensional electron gas 2DEG between the gate electrode layer 630 and the drain electrode layer 620 from each other without application of a gate voltage. The side face of the gate recess 560 is not necessarily perpendicular to the carrier transporting layer 530 and the barrier layer 540, but may be formed inclined. The side faces of the contact holes 570 may also be formed inclined.

The following describes the operation of the semiconductor device 500. When a gate voltage is applied to the gate electrode layer 630, electrons are accumulated in the carrier transporting layer 530 that are in contact with the bottom and the sides of the gate insulating film 590 which is in contact with the bottom and the sides of the gate electrode layer 630. These accumulated electrons serve to interconnect the two-dimensional electron gases 2DEG present between the source electrode layer 610 and the drain electrode layer 620. Accordingly, under application of a voltage between the source electrode layer 610 and the drain electrode layer 620, electric current flows between the source electrode layer 610 and the drain electrode layer 620.

FIG. 13 is a diagram showing specifications of the gate insulating film according to the fourth embodiment and experimental results. FIG. 13 shows the results with respect to samples D1 and D2. Both the samples D1 and D2 employed $SiO_2$ having the relative permittivity $\varepsilon 1=4$ for the first insulation film 592 and $HfO_2$ having the relative permittivity $\varepsilon 2=16$ for the second insulation film 594. With respect to the sample D1, the film thickness d1 of the first insulation film 592 was 10 nm and the film thickness d2 of the second insulation film 594 was 40 nm. With respect to the sample D2, the film thickness d1 of the first insulation film 592 was 4 nm and the film thickness d2 of the second insulation film 594 was 55 nm. The value of Math Expression (8) was obtained by substituting these values into the left side of Math Expression (8). The samples D1 and D2 were checked for a shift of the threshold voltage like the first embodiment. The calculated value of Math Expression (8) is shown by the value rounded off to the unit. In the column of evaluation, the double circle shows the case that satisfies Math Expression (8b), and the single circle shows the case that satisfies Math Expression (8a). The samples D1 and D2 were designed at the rated voltage Vmax equal to 30 V. In the sample D1 satisfying Math Expression (8b), a shift of the threshold voltage occurred at the gate voltage of 17 V of not less than ½ of the rated voltage Vmax. In the sample D2 satisfying Math Expression (8a), on the other hand, no shift of the threshold voltage occurred at the gate voltage of 10 V, i.e., ⅓ of the rated voltage Vmax but a shift of the threshold voltage occurred at 13 V of less than ½ of the rated voltage Vmax.

This embodiment can suppress a shift of the threshold voltage even when the material of the second insulation film 594 is crystallized to generate carrier trapping levels in the film, like the first embodiment described above.

E. Other Modifications

In the respective embodiments described above, the first insulation film may be provided as an insulation film of relatively high withstand voltage made of, for example, silicon dioxide ($SiO_2$), aluminum oxide ($Al_2O_3$), silicon nitride (SiN) or aluminum oxynitride (AlON). In such aspect, the first insulation film may be any insulation film where FN (Fowler-Nordheim) tunnel current is produced at the field intensity of 7 to 8 MV/cm.

The second insulation film described above has either the single-layered structure or the two-layered structure, but may have a three-layered or more-layered structure. The material such as $Al_2O_3$, $HfO_2$, $ZrO_2$ or ZrOn is employed for the second insulation film in the above embodiments, but the second insulation film may be any other film satisfying $d1<d2$ and $\varepsilon 1<\varepsilon 2$ in relation to the first insulation film.

In semiconductor devices, the material of the semiconductor layers is not limited to GaN but may be another material system, such as SiC or Si. The invention is not limited to the vertical or horizontal MOSFET but is similarly applicable to any other semiconductor device having the insulated gate structure, such as IGBT (Insulated Gate Bipolar Transistor).

In the embodiments described above, the invention is designed for the rated voltage Vmax of 30 V applicable to the gate electrode layer. This is, however, not restrictive, and the invention is effective for any semiconductor device having the rated voltage Vmax of not less than 10 V. The invention is similarly applicable to any semiconductor device having the rated voltage Vmax of 15 V, 20 V, 50 V, 100 V, 1000 V or even over 1000 V. The value of the rated voltage Vmax is not limited to the above embodiments.

The invention is not limited to the above embodiments, examples or modifications, but a diversity of variations and modifications may be made to the embodiments without departing from the scope of the invention. For example, the technical features of the embodiments, examples or modifications corresponding to the technical features of the respective aspects described in SUMMARY OF INVENTION may be replaced or combined appropriately, in order to solve part or all of the problems described above or in order to achieve part or all of the advantageous effects described above. Any of the technical features may be omitted appropriately unless the technical feature is described as essential herein.

The invention claimed is:
1. A method of driving a semiconductor device, the semiconductor device comprising:
  a gate insulating film stacked on one surface of a semiconductor layer; and
  a gate electrode layer stacked on the gate insulating film and provided to apply a voltage via the gate insulating film for formation of a channel in the semiconductor layer, wherein the gate insulating film includes:
a first insulation film stacked on one surface of the semiconductor layer; and
a second insulation film placed between the first insulation film and the gate electrode layer, wherein
when ε1 and ε2 respectively represent relative permittivities of the first insulation film and the second insulation film, d1 [nm] and d2 [nm] represent film thicknesses of the first insulation film and the second insulation film, Vmax [V] represents a rated voltage applicable to the gate electrode layer and is equal to or greater than 10 [V], and FI represents a field intensity of the gate insulating film,
a shift of a threshold voltage of the semiconductor device occurs at a voltage equal to or greater than ½ of Vmax, and
the gate insulating film is configured to satisfy ε1<ε2 and FI≤21 [MV/cm],
wherein $$FI = \frac{V\max}{d1 + \frac{\varepsilon 1}{\varepsilon 2} \cdot d2}, \text{ and}$$

wherein the method of driving a semiconductor device includes:
applying a gate voltage V of ⅓ to ½ of Vmax to the gate electrode layer, such that when a dielectric breakdown field intensity of the first insulation film is E1*bd* [MV/cm], the gate insulating film is further configured to satisfy E1*bd*≤FI≤16.

2. The method of driving a semiconductor device according to claim 1, wherein the film thickness d1 of the first insulation film is equal to or greater than 10 nm.

3. The method of driving a semiconductor device according to claim 1, wherein the film thickness d2 of the second insulation film is greater than the film thickness d1 of the first insulation film.

4. The method of driving a semiconductor device according to claim 1, wherein the gate insulating film is further configured to satisfy 10≤FI≤16.

5. The method of driving a semiconductor device according to claim 1, wherein a field intensity applied to the first insulation film is less than or equal to 8 MV/cm.

6. The method of driving a semiconductor device according to claim 1, wherein
the semiconductor device comprises a trench gate type semiconductor device, and
the gate electrode layer is arranged in a trench formed in the semiconductor layer.

7. The method of driving a semiconductor device according to claim 1, wherein the semiconductor layer comprises:
a first conductivity-type semiconductor layer formed on a substrate, and comprising doped GaN;
a second conductivity-type semiconductor layer formed on the first conductivity-type semiconductor layer; and
an other first conductivity-type semiconductor layer formed on the second conductivity-type semiconductor layer.

8. The method of driving a semiconductor device according to claim 7, wherein the gate insulating film is formed in a trench formed in the semiconductor layer, a bottom of the trench being formed in first conductivity-type semiconductor layer.

9. The method of driving a semiconductor device according to claim 8, wherein the first insulation film is formed on a bottom surface of the trench and a side surface of the trench, and on an upper surface of the other first conductivity-type semiconductor layer.

10. The method of driving a semiconductor device according to claim 7, wherein a bottom of the gate electrode is formed at a height which is less than a height of a surface of the first conductivity-type semiconductor layer.

11. A method of designing a semiconductor device, the method comprising:
designing a semiconductor device comprising:
a gate insulating film stacked on one surface of a semiconductor layer; and
a gate electrode layer stacked on the gate insulating film and provided to apply a voltage via the gate insulating film for formation of a channel in the semiconductor layer, wherein
the gate insulating film includes:
a first insulation film stacked on one surface of the semiconductor layer; and
a second insulation film placed between the first insulation film and the gate electrode layer,
wherein when ε1 and ε2 respectively represent relative permittivities of the first insulation film and the second insulation film, d1 [nm] and d2 [nm] represent film thicknesses of the first insulation film and the second insulation film, Vmax [V] represents a rated voltage applicable to the gate electrode layer and is equal to or greater than 10 [V], and FI represents a field intensity of the gate insulating film,
a shift of a threshold voltage of the semiconductor device occurs at a voltage equal to or greater than ½ of Vmax, and
the gate insulating film is configured to satisfy ε1<ε2 and FI≤21 [MV/cm],
wherein $$FI = \frac{V\max}{d1 + \frac{\varepsilon 1}{\varepsilon 2} \cdot d2},$$

wherein when a gate voltage V of ⅓ to ½ of Vmax is applied to the gate electrode layer, and a dielectric breakdown field intensity of the first insulation film is E1*bd* [MV/cm], the gate insulating film is further configured to satisfy E1*bd*≤FI≤16.

* * * * *